United States Patent
Kwon et al.

(10) Patent No.: US 12,484,187 B2
(45) Date of Patent: Nov. 25, 2025

(54) COOLING APPARATUS FOR POWER MODULE

(71) Applicants: Hyundai Motor Company, Seoul (KR); Kia Corporation, Seoul (KR)

(72) Inventors: Se Heun Kwon, Incheon (KR); Hyong Joon Park, Hwaseong-Si (KR); Sang Hun Lee, Taebaek-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 210 days.

(21) Appl. No.: 18/389,091

(22) Filed: Nov. 13, 2023

(65) Prior Publication Data

US 2025/0008689 A1    Jan. 2, 2025

(30) Foreign Application Priority Data

Jun. 28, 2023 (KR) .................. 10-2023-0083717
Oct. 16, 2023 (KR) .................. 10-2023-0137727

(51) Int. Cl.
H05K 7/20    (2006.01)

(52) U.S. Cl.
CPC ..... *H05K 7/20272* (2013.01); *H05K 7/20263* (2013.01); *H05K 7/20927* (2013.01)

(58) Field of Classification Search
CPC ........... H05K 7/20272; H05K 7/20263; H05K 7/20927
USPC ...................................................... 361/688
See application file for complete search history.

(56) References Cited

U.S. PATENT DOCUMENTS

| | | | |
|---|---|---|---|
| 9,445,526 B2 | 9/2016 | Zhou et al. | |
| 2003/0053298 A1* | 3/2003 | Yamada | H05K 7/20927 361/728 |
| 2006/0119512 A1* | 6/2006 | Yoshimatsu | H01L 25/112 342/372 |
| 2016/0095264 A1* | 3/2016 | Kaneko | H05K 7/20909 361/699 |
| 2018/0040537 A1* | 2/2018 | Grassmann | B60R 16/02 |
| 2019/0141864 A1* | 5/2019 | Dixler | H05K 7/20927 |
| 2022/0386509 A1* | 12/2022 | Zhou | H05K 7/209 |

FOREIGN PATENT DOCUMENTS

| | | |
|---|---|---|
| KR | 10-2014-0084590 | 7/2014 |
| KR | 10-2023-0090747 | 6/2023 |
| KR | 10-2023-0094013 | 6/2023 |
| KR | 10-2023-0169642 | 12/2023 |

* cited by examiner

*Primary Examiner* — Zhengfu J Feng
(74) *Attorney, Agent, or Firm* — Morgan Lewis & Bockius LLP

(57) ABSTRACT

A cooling apparatus for power modules includes a manifold cover and a pin plate, and generates vertical turbulent flow of the cooling fluid in such a way as to spray the cooling fluid vertically onto the heat-generating surface using cooling fins of a pin plate configured in the lengthwise and vertical directions of a manifold cover, which ensures cooling efficiency while minimizing flow rate losses caused by the vertical turbulent flow by improving the flow efficiency of the cooling fluid. The manifold cover is provided with a plurality of flow paths for the circulation of the cooling fluid that have different directions respectively for the inflow and the circulation of the cooling fluid and are different in volume or width, minimizing pressure losses during fluid circulation and resolving cooling imbalances through the cooling fins.

15 Claims, 4 Drawing Sheets

COOLING APPARATUS FOR POWER MODULE

CROSS REFERENCE TO RELATED APPLICATION

The present application claims priority to Korean Patent Application Nos. 10-2023-0083717, filed Jun. 28, 2023, and 10-2023-0137727, filed Oct. 16, 2023, the entire contents of which is incorporated herein for all purposes by this reference.

BACKGROUND OF THE PRESENT DISCLOSURE

Field of the Present Disclosure

The present disclosure relates to a power module cooling apparatus for cooling a power module using a cooling fluid.

Description of Related Art

Power modules are used in electric vehicles and other applications to control high voltage and high current. As a result, power modules generate a lot of heat and thus need to be cooled properly to maintain performance and durability. To achieve this, power modules are cooled using a cooling fluid, and the waste heat from the power modules is used for mobility heating.

Typically, it was common to connect a cooling device to one side of the power module for cooling purposes and circulate a cooling fluid through the cooling device. However, the conventional cooling devices, which typically employ simple tube structures or fin structures, have encountered issues with limited cooling efficiency.

When a plurality of power modules are present, there is a decrease in cooling efficiency for the power modules that are cooled later compared to the power module which is cooled first. Such cooling imbalance in power modules can result in performance degradation of the power modules.

Accordingly, the cooling efficiency of electric vehicles and other mobility devices is closely related to the overall energy efficiency of mobility, and it also includes a significant impact on the durability and performance maintenance of power modules, necessitating the improvement of power module cooling efficiency through a new cooling structure.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a cooling apparatus for power modules that ensures cooling efficiency by generating vertical turbulent flow of the cooling fluid in such a way as to spray the cooling fluid vertically onto the heat-generating surface through cooling fins of a pin plate configured in the lengthwise and vertical directions of a manifold cover, while minimize flow rate losses caused by the vertical turbulent flow by improving the flow efficiency of the cooling fluid.

To accomplish the above object, a cooling apparatus for power modules according to an exemplary embodiment of the present disclosure includes a manifold cover configured to circulate cooling fluid and house a power module and a cooling channel section matching the power module, the cooling channel section including a plurality of guide flow paths among which a first flow path is formed to have one end portion open on an upstream side and a decreasing cross-sectional area toward the downstream side and a second flow path is formed to have one end portion open on the downstream side and an increasing cross-sectional area toward the downstream side, and a pin plate housed in the manifold cover, contacting with the power module, and including cooling pins facing the cooling channel section and extending in a second direction crossing the first direction, allowing the cooling fluid entering the first flow path to flow between the cooling pins and then exit through the second flow path.

The first flow path of the cooling channel section is formed with the one end portion open on the upstream side and the other end portion closed on the downstream side for the cooling fluid to enter from the open end portion and circulate through the cooling fins, and the second flow path is formed with one end portion closed on the upstream side and the other end portion open on the downstream side for the cooling fluid entered through the cooling fins to circulate toward the downstream side.

The first flow path of the channel cooling section decreases in height toward the downstream side, and the second flow path increases in height toward the downstream side.

The first flow path of the channel cooling section decreases in width toward the downstream side, and the second flow path increases in width toward the downstream side.

The manifold cover includes a barrier portion formed between the first flow path and the second flow path separating the first flow path and the second flow path.

The manifold cover houses a plurality of power modules and a plurality of cooling channel sections corresponding to the power modules, and the cooling channel sections include a connecting duct connecting the second flow path of the cooling channel section located on the upstream side and the first flow path of the cooling channel section located on the downstream side to fluidically-communicate with each other.

The connecting duct includes an inlet portion formed on the downstream side and connected to the second flow path of the cooling channel section and an outlet portion branched out and extending diagonally from the inlet portion and connected to at least two of the first flow paths, merging outlet portions of different connecting ducts with one of the first flow paths.

The connecting duct forms a triangular shape at the branching point from the inlet portion to the outlet portion.

The manifold cover houses a first power module, a second power module, and a third power module, and the cooling channel section includes a first cooling channel section, a second cooling channel section, and a third cooling channel section, the third cooling channel section being smaller in volume for the guide flow paths than the first cooling channel section and the second cooling channel section.

The cooling apparatus for power modules, constructed as described above, is advantageous in terms of ensuring cooling efficiency by generating vertical turbulent flow of the cooling fluid in such a way as to spray the cooling fluid vertically onto the heat-generating surface through cooling fins of a pin plate configured in the lengthwise and vertical directions of a manifold cover, while minimizing flow rate losses caused by the vertical turbulent flow by improving the flow efficiency of the cooling fluid.

the manifold cover is provided with a plurality of flow paths for the circulation of the cooling fluid that have different directions respectively for the inflow and the circulation of the cooling fluid and are different in volume or width, minimizing pressure losses during fluid circulation and resolving cooling imbalances through the cooling fins.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
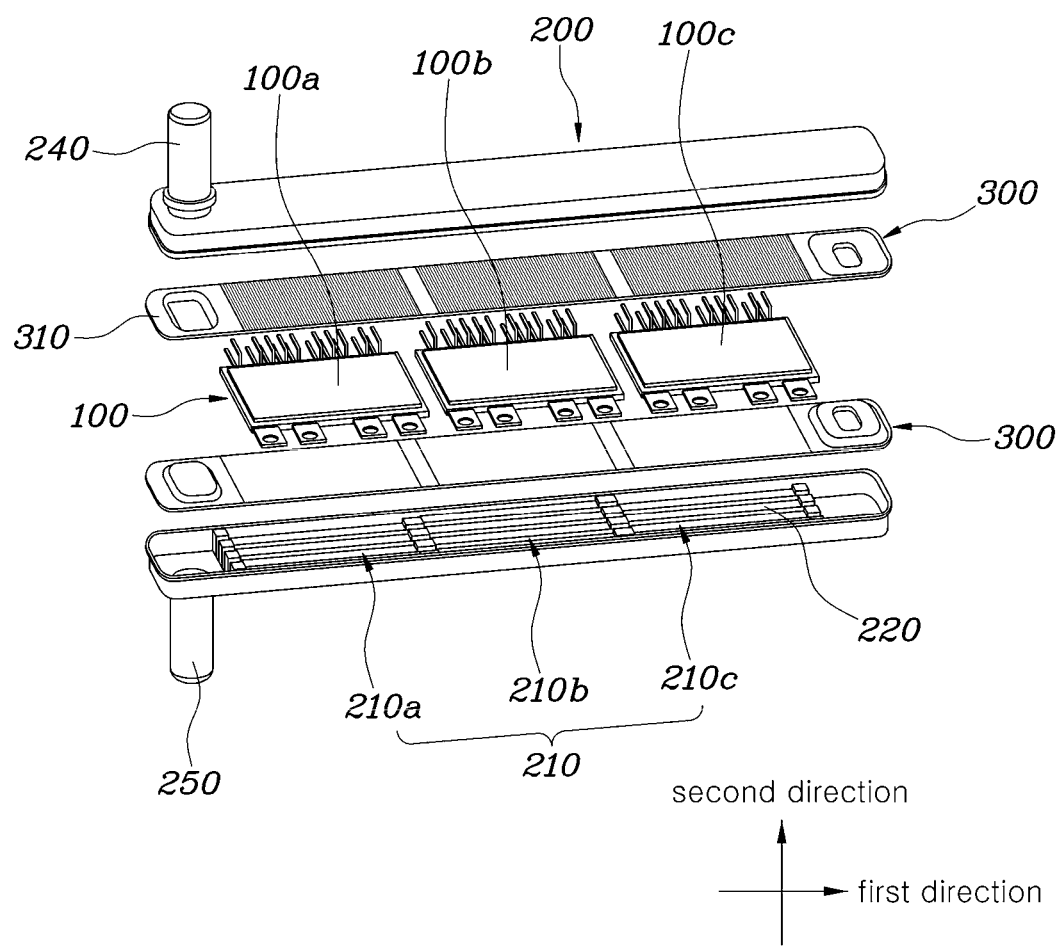
FIG. 1 is an exploded perspective view of a cooling apparatus for a power module according to various exemplary embodiments of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, descriptions include the exemplary embodiments included in the present specification with reference to the accompanying drawings in which the same reference numbers are assigned to refer to the same or like components and redundant description thereof is omitted.

As used in the following description, the suffix "module" and "unit" are granted or used interchangeably in consideration of easiness of description but, by itself, including no distinct meaning or role.

Furthermore, detailed descriptions of well-known technologies related to the exemplary embodiments included in the present specification may be omitted to avoid obscuring the subject matter of the exemplary embodiments included in the present specification. Furthermore, the accompanying drawings are only for easy understanding of the exemplary embodiments included in the present specification and do not limit the technical spirit included herein, and it should be understood that the exemplary embodiments include all changes, equivalents, and substitutes within the spirit and scope of the present disclosure.

As used herein, terms including an ordinal number such as "first" and "second" may be used to describe various components without limiting the components. The terms are used only for distinguishing one component from another component.

It will be understood that when a component is referred to as being "connected to" or "coupled to" another component, it may be directly connected or coupled to the other component or intervening component may be present. In contrast, when a component is referred to as being "directly connected to" or "directly coupled to" another component, there are no intervening component present.

As used herein, the singular forms are intended to include the plural forms as well, unless the context clearly indicates otherwise.

It will be further understood that the terms "comprises" or "has," when used in the present specification, specify the presence of a stated feature, number, step, operation, component, element, or a combination thereof, but they do not preclude the presence or addition of one or more other features, numbers, steps, operations, components, elements, or combinations thereof.

Hereinafter, a description includes the cooling apparatus for power modules according to various exemplary embodiments of the present disclosure with reference to accompanying drawings.

Figure 2:
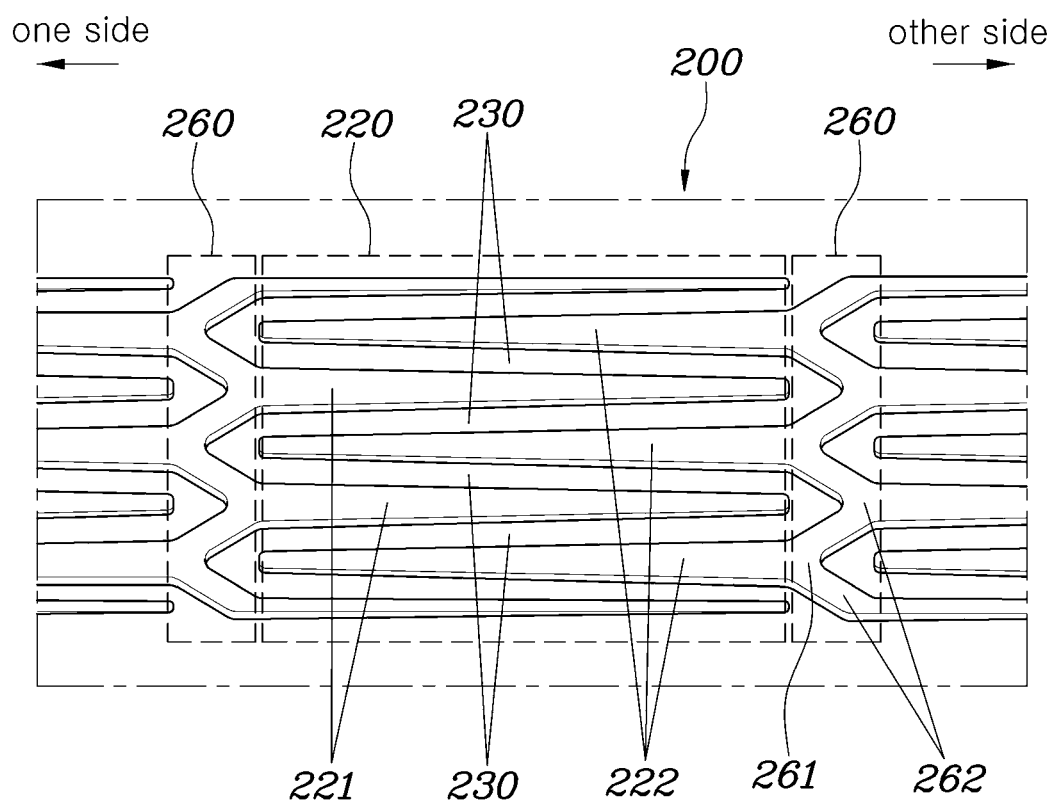
FIG. 2 is a diagram illustrating a cooling channel section of a manifold cover of the cooling apparatus for power modules in FIG. 1.

As shown in FIG. 1 and FIG. 2, the cooling apparatus for power modules according to an exemplary embodiment of the present disclosure includes a manifold cover 200 configured to circulate cooling fluid and house a power module 100 and a cooling channel section 210 matching the power module 100, the cooling channel section 210 including a plurality of guide flow paths 220 among which a first flow path 221 is formed to have one end portion open on one side thereof and a gradually decreasing cross-sectional area toward the other side thereof and a second flow path 222 formed to have one end portion open on the other side and a gradually increasing cross-sectional area toward the other side; and a pin plate 300 housed in the manifold cover 200, contacting with the power module 100, and including cooling pins 310 facing the cooling channel section 210 and extending in a second direction crossing the first direction, allowing the cooling fluid entering the first flow path 221 to flow between the cooling pins 310 and then exit through the second flow path 222.

The manifold cover 200 is formed to allow the cooling fluid to circulate inside and includes an inlet port 240 for the cooling fluid to enter and an outlet port 250 for the cooling fluid passed through the power module 100 to exit.

Within the manifold cover 200, a cooling channel section 210 is formed to match the power module 100, allowing the circulation of the cooling fluid through the cooling channel section 210, which causes heat exchange to occur between the cooling fluid and the power module 100 through the cooling channel section 210, allowing for the cooling of the power module 100. The cooling channel section 210 includes a plurality of guide flow paths 220 including a first flow path 221 and a second flow path 222, which are designed to change the direction of fluid circulation.

The pin plate 300, housed within the manifold cover 200, includes cooling pins 310 that face the cooling channel section 210.

The first flow path 221 has one end portion open on one side and the other end portion closed on the other side, allowing fluid to enter from one side and circulate through the cooling pins 310, and the second flow path 222 has one end portion closed on the one side and the other end portion open on the other side, allowing fluid entered through the cooling pins 310 to circulate toward the other side thereof.

Consequently, the cooling fluid that circulates inside the manifold cover 200 flows through the first flow path 221 across the cooling pins 310 and then exits through the second flow path 222. Furthermore, the first and second flow paths 221 and 222 extend in the first direction and are alternately arranged in the second direction, forming a impingement jet cooling structure as the cooling fluid passes through the cooling pins 310 in the first flow path 221 and enters the second flow path 222.

That is, the cooling channel section 210 includes a plurality of guide flow paths 220 extending in the first direction, the guide flow paths 220 including the first flow path 221 with one end portion open for fluid entry and the other end portion closed and the second flow path 222 with one end portion closed and the other end portion open for fluid discharge, the first and second flow paths 221 and 222 arranged alternately.

The cooling pins 310 of the pin plate 300 come into contact with the first and second flow paths 221 and 222 in the cooling channel section 210, allowing for the cooling fluidical communication between the first flow path 221 and the second flow path 222.

Figure 3:
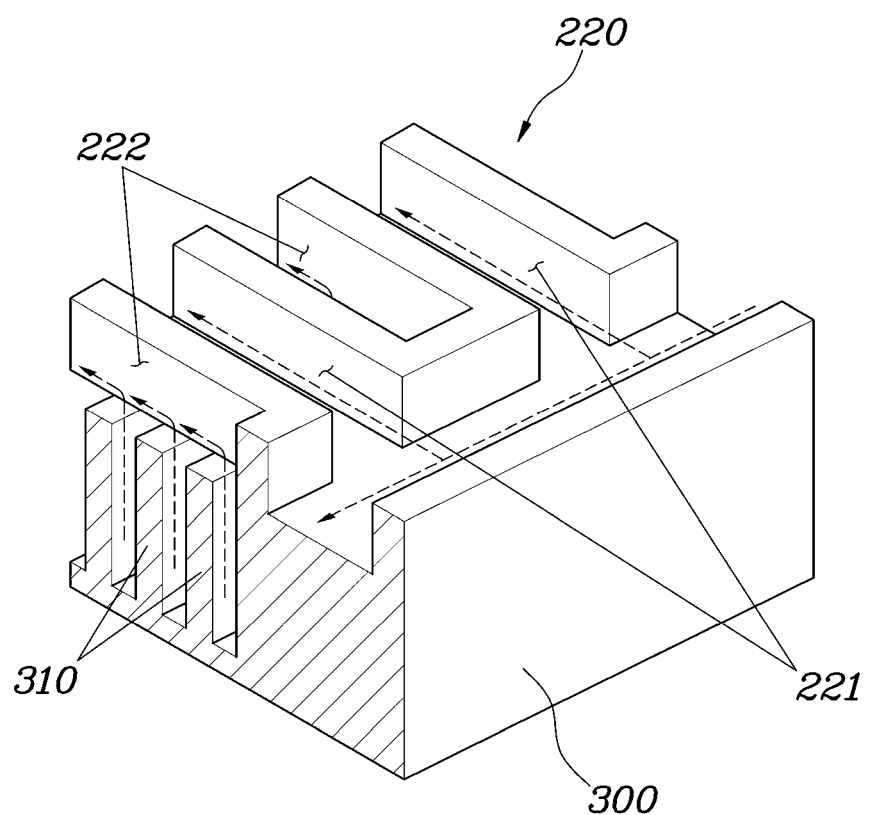
FIG. 3 is a diagram illustrating a impingement jet effect in a cooling apparatus for power modules according to an exemplary embodiment of the present disclosure.
Figure 4:
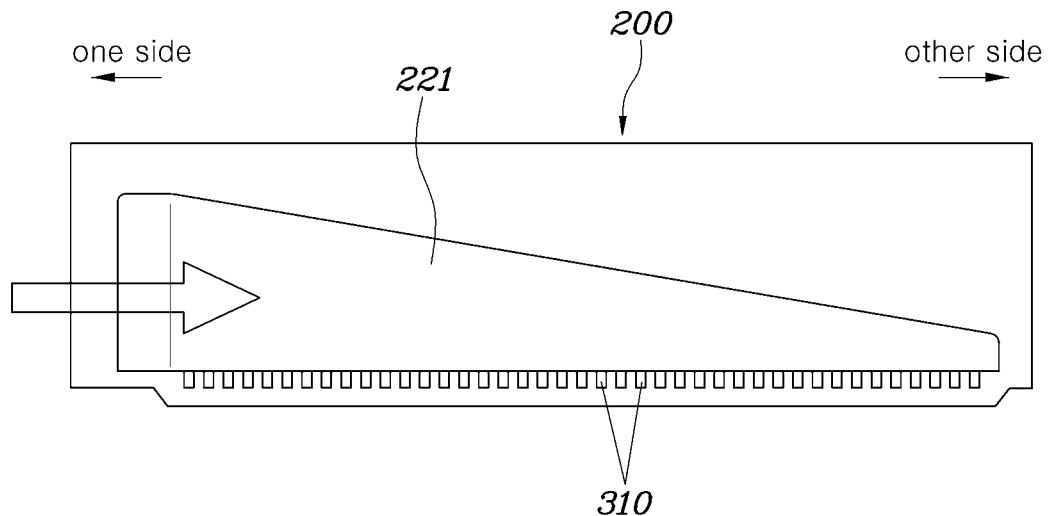
FIG. 4 is a diagram illustrating a first flow path of a cooling apparatus for power modules according to an exemplary embodiment of the present disclosure.
Figure 5:
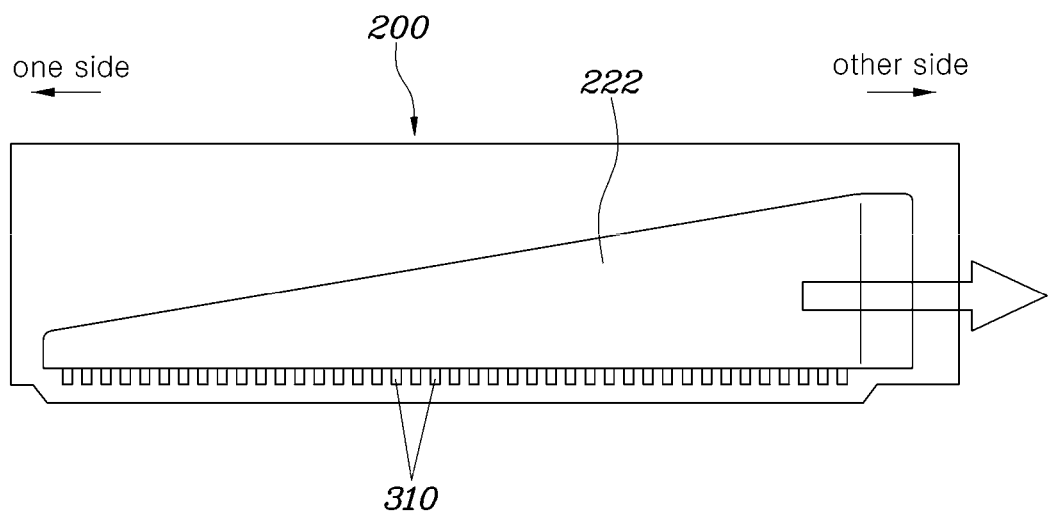
FIG. 5 is a diagram illustrating a second flow path of a cooling apparatus for power modules according to an exemplary embodiment of the present disclosure.

As shown in FIG. 3, the cooling pins 310 of the pin plate 300 are formed to extend in the second direction perpendicular to the first direction, which extends in the direction of the guide flow paths 220 extending in the first direction thereof.

In other words, the first and second flow paths 221 and 222 extend in the first direction, while the cooling pins 310 extend in the second direction, allowing the cooling fluid to flow from the first flow path 221 to the second flow path 222 through the cooling pins 310. In the present way, during the circulation from the first flow path 221 to the second flow path 222, the cooling fluid induces turbulent flow as a velocity component in the vertical direction, forming a impingement jet cooling structure.

As a result, the cooling fluid circulating inside the manifold cover 200 is distributed into the plurality of first flow paths 221 open on one side in the direction of cooling fluid inflow and closed on the other side, allowing the cooling fluid to flow between the cooling pins 310 of the pin plate 300 and then circulate to the second flow path 222. The second flow path 222 is open on the other side in the direction of cooling fluid discharge and closed on the one side, allowing the cooling fluid entered the second flow path 222 to be discharged to the outside of the manifold cover 200.

In the present way, the impingement jet cooling structure formed by the cooling fluid flow according to an exemplary embodiment of the present disclosure improves the cooling performance of the power module 100. Impingement jet cooling is a cooling technique in which cooling air is directly injected onto a high-temperature surface to remove heat, resulting in a localized high heat transfer effect. To effectively implement the present impingement jet cooling effect, it is necessary to utilize turbulent flow rather than laminar flow. Turbulent flow refers to a flow with velocity components in the vertical direction to the flow direction, i.e., an irregular and diffusive flow with three-dimensional (3D) vorticity in the up, down, left and right directions other than the flow direction thereof. When turbulence is present around an object, the cooling area and mixing of the cooling fluid increase, enhancing cooling efficiency.

A detailed description of jet impingement cooling is made hereinafter. FIG. 3 is a diagram illustrating the microchannels of a cooling apparatus for a power module 100 according to various exemplary embodiments of the present disclosure. As shown in FIG. 3, the cooling fluid is introduced from the inlet and forms an inlet plenum, which is a combination of narrow streams of water. The cooling fluid entering the first flow path 221 or the second flow path 222 of the manifold cover 200 flows through a plurality of cooling pins 310. That is, as the cooling fluid enters the first flow path 221 and encounters an obstruction at the outlet side, it flows through the cooling pins 310 and then enters the second flow path 222, generating turbulence in the process. Furthermore, the second flow path 222, which is closed at the inlet side, allows the cooling fluid to flow to the outlet side, passing through the cooling pins 310, and be discharged. As a result, the cooling fluid, which exhibits higher irregularity and diffusion, generates a more pronounced impingement jet cooling effect. Thus, the present disclosure ensures the cooling performance of the power module 100 through the impingement jet cooling effect achieved by the cooling channel section 210 of the manifold cover 200 and the cooling pins 310 of the pin plate 300.

The manifold cover 200 according to an exemplary embodiment of the present disclosure enhances the circulation flow of the cooling fluid by shaping the first flow path 221 and the second flow path 222 of the guide flow paths 220 forming the cooling channel section 210.

That is, as the first flow path 221 is shaped with a gradually decreasing cross-sectional area toward the other side, the flow of the cooling fluid is induced in the direction in which the cooling fluid needs to circulate. This is achieved through the phenomenon known as the vena contracta in which the cross-section of the first flow path 221 gradually narrows toward the other side, causing the cooling fluid to contract and flow smoothly toward the outlet side, enabling effective circulation of the cooling fluid.

Furthermore, as the second flow path 222 is shaped with a gradually increasing cross-sectional area toward the other side, the flow of the cooling fluid is induced in the direction in which the cooling fluid needs to circulate. That is, in the case of the second flow path 222, as the cooling fluid circulates from the one side to the other side, the pressure decreases due to the increase in cross-sectional area, allowing the cooling fluid entering the second flow path 222 through the cooling pins 310 to circulate smoothly toward the other side thereof.

According to an exemplary embodiment of the present disclosure, the cooling channel section 210 may be formed in a way that the height of the first flow path 221 gradually decreases toward the other side while the height of the second flow path 222 gradually increases toward the other side thereof.

By forming the first flow path 221 with a downward slope toward the other side, the height gradually decreases, improving the flow circulation of the cooling fluid due to the vena contracta effect. The first flow path 221 may include an inclination angle of approximately 3° to 8° at the top, and the slope angle may be adjusted through experiments conducted with the flow of the cooling fluid.

By forming the second flow path 222 with an upward slope toward the other side, the height to gradually increase, allowing for smooth circulation of the cooling fluid in the second flow path 222 due to the pressure difference between the one side and the other side. Thereof. The second flow path 222 may be formed with a slope of approximately 3° to 8° at the top, which is the same angle as the first flow path 221, or a different slope depending on the flow of the cooling fluid to enhance the circulation flow of the cooling fluid.

In another exemplary embodiment of the present disclosure, the first cooling channel section 210a may be formed in a way that the width of the first flow path 221 becomes narrower toward the other side while the height of the second flow path 222 gradually increases toward the other side thereof.

In another exemplary embodiment of the present disclosure, by forming the first flow path 221 with gradually narrowing widths and heights on both sides toward the other side, the circulation flow of the cooling fluid due to the vena contracta may be enhanced. By forming the second flow path 222 with gradually broadening widths and heights of on both sides toward the other side, the pressure difference between the one side and the other side may facilitate the flow of the cooling fluid.

The manifold cover 200 in an exemplary embodiment of the present disclosure is formed with the first and second flow paths 221 and 222 of which the cross-sectional area, height, and width gradually decrease or increase, resulting in minimized circulation loss, improved flow, enhanced flow efficiency of the cooling fluid, and ultimately improved cooling performance.

Meanwhile, the manifold cover 200 may include a barrier portion 230 formed between the first flow path 221 and the second flow path 222 for separation therebetween.

The barrier portion 230 is positioned between the plurality of first flow paths 221 and second flow paths 222 within the manifold cover 200, generating dead zones where the cooling fluid circulates only through the cooling pins 310.

As a result, the cooling fluid circulating inside the manifold cover 200 induces turbulent flow as a vertical component in the first flow path 221, leading to the formation of a impingement jet cooling structure. Additionally, the presence of the barrier portion 230 between the first flow path 221 and the second flow path 222 increases the residence time of the cooling fluid in contact with the cooling pins 310, allowing for effective heat exchange.

Furthermore, as the manifold cover 200 accommodates a plurality of power modules 100, the cooling channel section 210 is configured accordingly to match each power module 100, and the connecting ducts 260 are provided to establish connection and fluidical communication between the second flow path 222 of the cooling channel section 210 located on one side and the first flow path 221 of the cooling channel section 210 located on the other side thereof.

The plurality of power modules 100 may be arranged in series within the internal space of the manifold cover 200, and the cooling channel sections 210 may be serially arranged in the direction of alignment of the power modules 100.

Each cooling channel section 210 is provided with connecting ducts 260, allowing for connection and fluidical communication between the first flow path 221 and the second flow path 222 of different cooling channel sections 210 through the connecting ducts 260.

As shown in FIG. 2, the other-side end portion of the second flow path 222 of a cooling channel section 210 located on one side may be connected to the one-side end portion of the first flow path 221 of a cooling channel section 210 located on the other side through a connecting duct 260. That is, by connecting the other-side end portion of the second flow path 222, which is open on the outlet side, to the one-side end portion of the first flow path 221, which is open on the inlet side, via a connecting duct 260, the cooling fluid may circulate in each cooling channel section 210.

In detail, the connecting duct 260 is connected, at the inlet portion 261 thereof located on the one side, to the second flow path 222 of a cooling channel section 210, and at an outlet portion 262 thereof branched out and extending diagonally, to at least two of the first flow paths 221 of the cooling channel section 210 located at the other side, allowing the outlet portions 262 of different connecting ducts 260 to merge with one of the first flow paths 221.

That is, as shown in FIG. 2, a plurality of cooling channel sections 210 is provided with first flow paths 221 and second flow paths 222, and the first flow paths 221 and second flow paths 222 within each cooling channel section 210 are arranged at the same location, respectively, in the same direction thereof. Accordingly, the connecting duct 260 is formed to extend diagonally, with the inlet portion 261 connected to the second flow path 222 of a cooling channel section 210 located on one side, and the outlet portion 262 connected to the first flow path 221 of a cooling channel section 210 located on the other side, allowing for fluidical communication between the first flow paths 221 and second flow paths 222 of each cooling channel section 210.

Furthermore, the connecting duct 260 in an exemplary embodiment of the present disclosure may be configured with an inlet portion 261 and two outlet portions 262. That is, the inlet portion 261 of the connecting duct 260 is connected to the second flow path 222 of a cooling channel section 210 located on the one side, while the outlet portions 262 extend diagonally and are connected to two first flow paths 221 of a cooling channel section 210 located on the other side, allowing the cooling fluid to disperse and rejoin as it circulates between different cooling channel sections 210.

As described above, the connecting duct 260 forms a triangular shape at the branching point from the inlet portion 261 to the outlet portion 262, reducing the flow resistance of the cooling fluid circulating through different cooling channel sections 210. This utilizes a pressure loss reduction structure based on the vena contracta phenomenon, maintaining a constant diameter of the flow path through the triangular shape in the connecting duct (260) to minimize pressure loss.

Furthermore, forming the second flow path 222 to include the cross-sectional area increasing and the first flow path 221 to include the cross-sectional area decreasing toward the other side in the circulation direction of the cooling fluid can reduce pressure loss due to vena contracta.

Meanwhile, the manifold cover 200 may house a first power module 100a, a second power module 100b, and a third power module 100c, and the cooling channel section 210 may include a first cooling channel section 210a, a second cooling channel section 210b, and a third cooling channel section 210c, the third cooling channel section 210c being formed to be smaller in volume than the first cooling channel section 210*a* and second cooling channel section 210*b*.

The first power module 100*a* may be configured in the U phase of power, the second power module 100*b* may be configured in the V phase of power, and the third power module 100*c* may be configured in the W phase of power, allowing each power module 100 to supply three-phase AC power to the external system.

Accordingly, the cooling channel section 210 of the manifold cover 200 may be configured with a first cooling channel section 210*a* to cool the first power module 100*a*, a second cooling channel section 210*b* to cool the second power module 100*b*, and a third cooling channel section 210*c* to cool the third power module 100*c*.

However, as the cooling fluid circulates while sequentially cooling the first power module 100*a*, the second power module 100*b*, and the third power module 100*c*, there is a possibility that the cooling efficiency of the third power module 100*c* may be reduced due to the cooling fluid being heated by the preceding power modules and exchanged heat.

Therefore, according to an exemplary embodiment of the present disclosure, the third cooling channel section 210*c* is formed with a smaller volume for the first flow path 221 and the second flow path 222 compared to the volume of the first cooling channel section 210*a* and the second cooling channel section 210*b*, allowing for higher cooling flow rate due to the increased vena contracta in the third cooling channel section 210*c* where the cooling fluid reaches last in the direction of fluid circulation, compared to the preceding cooling channel sections 210.

As a result, the cooling performance of the third cooling channel section 210*c* is ensured, allowing for temperature distribution balance with the other cooling channel sections 210.

The cooling apparatus for the power module 100, constructed as described above, ensures cooling efficiency by generating vertical turbulent flow of the cooling fluid through the cooling fins 310 of the pin plate 300 configured in the direction perpendicular to the manifold cover 200, allowing the cooling fluid to be vertically sprayed onto the heat-generating surface and improves flow efficiency of the cooling fluid, minimizing flow losses associated with vertical turbulent flow.

The plurality of flow paths through which the cooling fluid circulates in the manifold cover 200 are individually provided in the direction of fluid inflow and the direction of fluid circulation and formed with different volumes or widths, minimizing pressure loss during fluid circulation and resolving cooling imbalances through the cooling fins 310.

In an exemplary embodiment of the present disclosure, the vehicle may be referred to as being based on a concept including various means of transportation. In some cases, the vehicle may be interpreted as being based on a concept including not only various means of land transportation, such as cars, motorcycles, trucks, and buses, that drive on roads but also various means of transportation such as airplanes, drones, ships, etc.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of at least one of A and B". Furthermore, "one or more of A and B" may refer to "one or more of A or B" or "one or more of combinations of one or more of A and B".

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A cooling apparatus for a power module, the apparatus comprising:
    a cooling channel section;
    a manifold cover configured to circulate cooling fluid and house the power module and the cooling channel section matching the power module, wherein the cooling channel section includes a plurality of guide flow paths among which a first flow path is formed to have a first end portion open on an upstream side and a decreasing cross-sectional area toward a downstream side in a first direction and a second flow path is formed to have a first end portion open on the downstream side and an increasing cross-sectional area toward the downstream side from a second end portion of the second flow in the first direction; and
    a pin plate housed in the manifold cover, contacting with the power module, and including cooling pins facing the cooling channel section and extending in a second direction crossing the first direction, allowing the cooling fluid entering the first flow path to flow between the cooling pins and then exit through the second flow path.

2. The apparatus of claim 1,
    wherein the first flow path of the cooling channel section is formed with the first end portion open on the upstream side and a second end portion closed on the downstream side for the cooling fluid to enter from the open first end portion of the first flow path and circulate through the cooling fins, and wherein the second flow path is formed with the second end portion closed on the upstream side and the first end portion open on the downstream side for the cooling fluid entered through the cooling fins to circulate toward the downstream side.

3. The apparatus of claim 1, wherein the first flow path of the channel cooling section decreases in height toward the downstream side.

4. The apparatus of claim 3, wherein the second flow path increases in height toward the downstream side.

5. The apparatus of claim 3, wherein the second flow path increases in width toward the downstream side.

6. The apparatus of claim 1, wherein the first flow path decreases in width toward the downstream side.

7. The apparatus of claim 6, wherein the second flow path increases in height toward the downstream side.

8. The apparatus of claim 6, wherein the second flow path increases in width toward the downstream side.

9. The apparatus of claim 1, wherein the manifold cover includes a barrier portion formed between the first flow path and the second flow path separating the first flow path and the second flow path.

10. The apparatus of claim 1,
wherein the power module is in plural and the manifold cover houses the plurality of power modules and the cooling channel section is in plural and the plurality of cooling channel sections corresponding to the plurality of power modules, and
wherein the plurality of cooling channel sections include a connecting duct connecting a second flow path of a first cooling channel section located on the upstream side among the plurality of cooling channel sections and a first flow path of a second cooling channel section located on the downstream side among the plurality of cooling channel sections to fluidically-communicate with each other.

11. The apparatus of claim 10, wherein the connecting duct includes:
an inlet portion formed on the downstream side and connected to the second flow path of the first cooling channel section; and
an outlet portion branched out and extending diagonally from the inlet portion and connected to at least two of first flow paths of the second cooling channel section, for merging outlet portions of different connecting ducts with one of first flow paths of adjacent different connecting ducts.

12. The apparatus of claim 11, wherein the connecting duct forms a triangular shape at a branching point from the inlet portion to the outlet portion.

13. The apparatus of claim 1,
wherein the power module is in plural and the plurality of power modules include a first power module, a second power module, and a third power module in the first direction,
wherein the manifold cover houses the first power module, the second power module, and the third power module in the first direction, and
wherein the cooling channel section includes a first cooling channel section, a second cooling channel section, and a third cooling channel section in the first direction.

14. The apparatus of claim 13,
wherein the third cooling channel section is smaller in volume for the guide flow paths than the first cooling channel section and the second cooling channel section.

15. The apparatus of claim 13, wherein the first power module is configured in a U phase of power, the second power module is configured in a V phase of power, and the third power module is configured in a W phase of power.

* * * * *